(12) United States Patent
Kansaku

(10) Patent No.: US 8,623,759 B2
(45) Date of Patent: Jan. 7, 2014

(54) METHOD FOR MANUFACTURING SEMICONDUCTOR DEVICE

(76) Inventor: Takashi Kansaku, Chuo-ku (JP)

(*) Notice: Subject to any disclaimer, the term of this patent is extended or adjusted under 35 U.S.C. 154(b) by 127 days.

(21) Appl. No.: 13/085,782

(22) Filed: Apr. 13, 2011

(65) Prior Publication Data
US 2011/0269308 A1   Nov. 3, 2011

(30) Foreign Application Priority Data
Apr. 30, 2010 (JP) .................. 2010-105392

(51) Int. Cl.
*H01L 21/768* (2006.01)

(52) U.S. Cl.
USPC ..... 438/629; 438/637; 438/648; 257/E21.584

(58) Field of Classification Search
USPC .................................. 438/625–653
See application file for complete search history.

(56) References Cited

U.S. PATENT DOCUMENTS

| | | | | |
|---|---|---|---|---|
| 5,918,149 A * | 6/1999 | Besser et al. | ............... | 438/680 |
| 6,051,880 A * | 4/2000 | Kikuta | ............... | 257/751 |
| 6,054,382 A * | 4/2000 | Hsu et al. | ............... | 438/628 |
| 6,066,891 A * | 5/2000 | Yamaoka et al. | ............... | 257/751 |
| 6,268,290 B1 * | 7/2001 | Taguchi et al. | ............... | 438/688 |
| 6,274,487 B1 * | 8/2001 | Suzuki | ............... | 438/653 |
| 6,448,173 B1 * | 9/2002 | Clevenger et al. | ............... | 438/627 |
| 2001/0041439 A1 * | 11/2001 | Batra et al. | ............... | 438/632 |
| 2002/0064942 A1 * | 5/2002 | Dixit et al. | ............... | 438/637 |
| 2002/0090811 A1 * | 7/2002 | Kim et al. | ............... | 438/627 |
| 2004/0188851 A1 * | 9/2004 | Takewaki et al. | ............... | 257/774 |
| 2008/0070405 A1 * | 3/2008 | Park et al. | ............... | 438/656 |
| 2010/0068877 A1 * | 3/2010 | Yeh et al. | ............... | 438/592 |
| 2010/0184286 A1 * | 7/2010 | Kansaku | ............... | 438/625 |
| 2011/0097897 A1 * | 4/2011 | Tanaka | ............... | 438/653 |
| 2011/0298062 A1 * | 12/2011 | Ganguli et al. | ............... | 257/410 |

FOREIGN PATENT DOCUMENTS

| | | |
|---|---|---|
| JP | 09-213660 A | 8/1997 |
| JP | 10-233753 A | 8/1998 |
| JP | 2002-299436 A | 10/2002 |
| JP | 2008-091835 A | 4/2008 |
| JP | 2008-294211 A | 12/2008 |
| JP | 2010-165989 A | 7/2010 |
| JP | 2011-091242 A | 5/2011 |

OTHER PUBLICATIONS

Japanese Office Action issued Oct. 4, 2013 in corresponding Japanese Patent Application No. 2010-105392.

* cited by examiner

*Primary Examiner* — Savitr Mulpuri
(74) *Attorney, Agent, or Firm* — Sughrue Mion, PLLC

(57) ABSTRACT

In a method for manufacturing a semiconductor device, a first Ti film, a titanium nitride (TiN) film, a second Ti film, a first aluminum (Al) film and a second Al film are formed sequentially in a contact hole formed in a second interlayer insulating film and on a Cu wire. The first titanium (Ti) film is formed so that a ratio of a thickness of a first portion of the first Ti film on a bottom face of the contact hole to a thickness of a second portion of the first Ti film on the second interlayer insulating film becomes equal to or smaller than 5/100. Moreover, the second Al film is formed using an aluminum reflow method, in which the second Ti film and the first Al film are alloyed with each other to form an Al—Ti alloy film.

21 Claims, 8 Drawing Sheets

METHOD FOR MANUFACTURING SEMICONDUCTOR DEVICE

Figure 1:
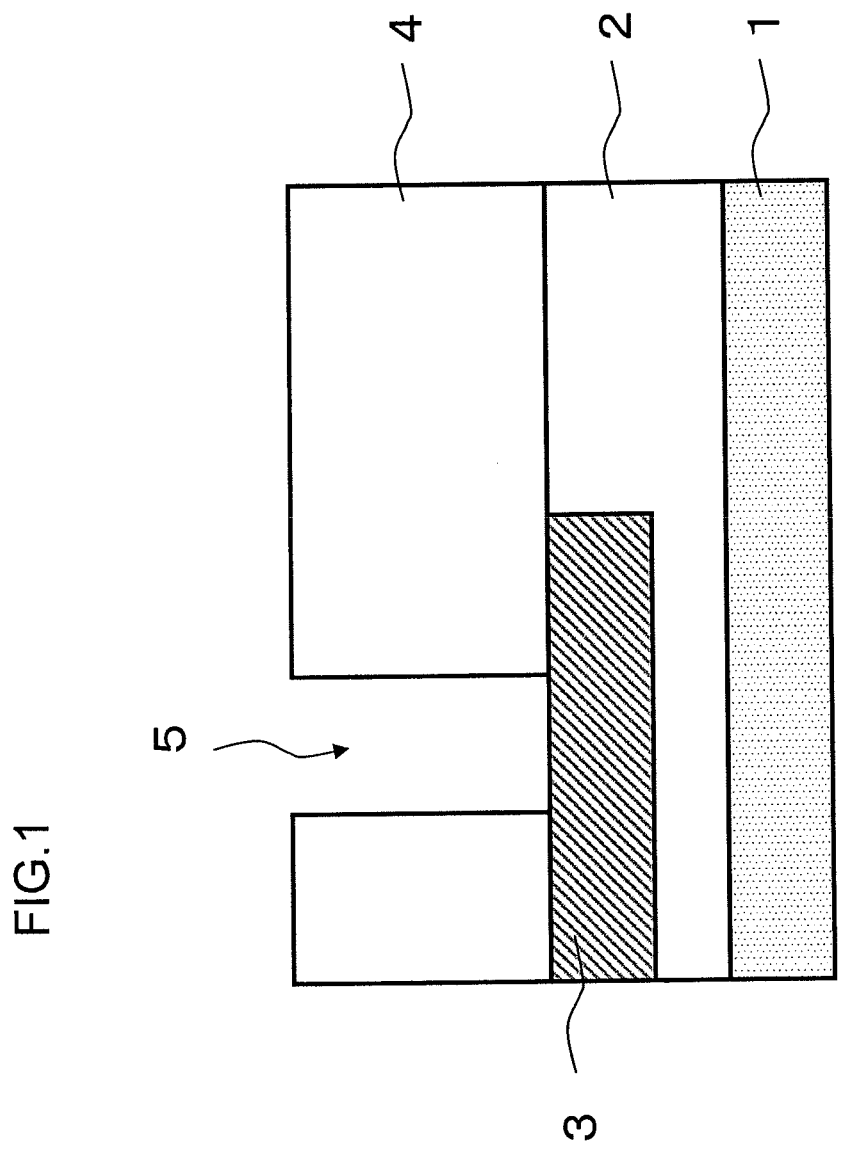

This application is based upon and claims the benefit of priority from Japanese Patent Application No. 2010-105392, filed on Apr. 30, 2010, the disclosure of which is incorporated herein in its entirety by reference.

TECHNICAL FILED

The invention relates to a method for manufacturing a semiconductor device.

RELATED ART

As a wire used in a semiconductor device gets finer and finer, copper (Cu) has recently been employed as material of the wire instead of aluminum (Al). In the semiconductor device with a multi-layered wire structure, it is common that an upper wire is made of Al and a lower wire is made of Cu. This is because it is possible to form a bonding pad for connecting to an external terminal in a package assembling process using the upper wire at the same time as in forming the upper wire.

A surface of a bonding pad made of Cu may tend to be naturally oxidized, thereby causing reduction of bonding strength in a bonding process. For this reason, there is a need to form a contact plug which interconnects the upper Al wire and lower Cu wire. As a method for forming the contact plug, an aluminum reflow method has been known which forms the contact plug using the upper Al wire material.

In such an aluminum reflow method, the Al and Cu may easily diffuse into each other and be alloyed with each other with thermal energy, resulting in a high resistance layer made of the alloy thereof. For this reason, in interconnecting the upper Al wire and lower Cu wire through the contact plug formed using the aluminum reflow method, there is highly required a barrier layer for preventing the Al and Cu from diffusing into each other.

Japanese Patent Laid-Open No. 2008-091835 discloses an example in which a metal oxide layer such as $TiO_x$ (titanium oxide) is employed as the barrier layer.

Moreover, Japanese Patent Laid-Open No. 1997-213660 discloses a method for forming the contact plug in which a film for the contact plug is formed in a contact hole with good coverage using a long throw sputtering method.

SUMMARY OF THE INVENTION

In one embodiment, there is provided a method for manufacturing a semiconductor device comprising:

forming a copper (Cu) wire in a first interlayer insulating film so as to be exposed;

forming a second interlayer insulating film on the first interlayer insulating film;

forming a contact hole in the second interlayer insulating film so as to expose the Cu wire;

forming a first titanium (Ti) film on an inner wall of the contact hole and on the second interlayer insulating film so that a ratio of a thickness of a first portion of the first Ti film on a bottom face of the contact hole to a thickness of a second portion of the first Ti film on the second interlayer insulating film becomes equal to or smaller than 5/100;

forming a titanium nitride (TiN) film, a second Ti film and a first aluminum (Al) film sequentially on the first Ti film formed on the inner wall of the contact hole and on the second interlayer insulating film; and forming a second Al film using an aluminum reflow method so as to fill the contact hole and cover the first Al film over the second interlayer insulating film, wherein when the aluminum reflow method is used, the second Ti film and the first Al film are alloyed with each other to form an Al—Ti alloy film.

In another embodiment, there is provided a method for manufacturing a semiconductor device, comprising:

forming a hole in an interlayer insulating film;

forming a first film on an inner wall of the hole and on the interlayer insulating film so that a thickness of a first portion of the first film on a bottom face of the hole is thinner than a thickness of a second portion of the first film on the interlayer insulating film;

forming a second film, a third film made of the same material as the first film and a fourth film sequentially on the first film formed on the inner wall of the hole and on the interlayer insulating film; and forming a fifth film made of the same material as the fourth film by heating so as to fill the hole and cover the fifth film over the interlayer insulating film.

In another embodiment, there is provided a method for manufacturing a semiconductor device, comprising:

forming a copper (Cu) wire in a first interlayer insulating film so as to be exposed;

forming a second interlayer insulating film on the first interlayer insulating film;

forming a contact hole in the second interlayer insulating film so as to expose the Cu wire;

forming a first titanium (Ti) film on an inner wall of the contact hole and on the second interlayer insulating film so that a thickness of a first portion of the first Ti film on a bottom face of the contact hole is thinner than a thickness of a second portion of the first Ti film on the second interlayer insulating film;

forming a titanium nitride (TiN) film on the first Ti film formed on the inner wall of the contact hole and on the second interlayer insulating film so that a thickness of a third portion of the TiN film over the bottom face of the contact hole is thinner than a thickness of a fourth portion of the TiN film over the second interlayer insulating film;

forming a second titanium (Ti) film on the TiN film over the inner wall of the contact hole and over the second interlayer insulating film so that a thickness of a fifth portion of the second Ti film over the bottom face of the contact hole is thinner than a thickness of a sixth portion of the second Ti film over the second interlayer insulating film;

forming a first aluminum (Al) film on the second Ti film over the inner wall of the contact hole and over the second interlayer insulating film so that a thickness of a seventh portion of the first Al film over the bottom face of the contact hole is thinner than a thickness of an eighth portion of the first Al film over the second interlayer insulating film; and forming a second Al film using an aluminum reflow method so as to fill the contact hole and cover the first Al film over the second interlayer insulating film, wherein when the aluminum reflow method is used, the second Ti film and the first Al film are alloyed with each other to form an Al—Ti alloy film.

BRIEF DESCRIPTION OF ACCOMPANYING DRAWINGS

Figure 6:
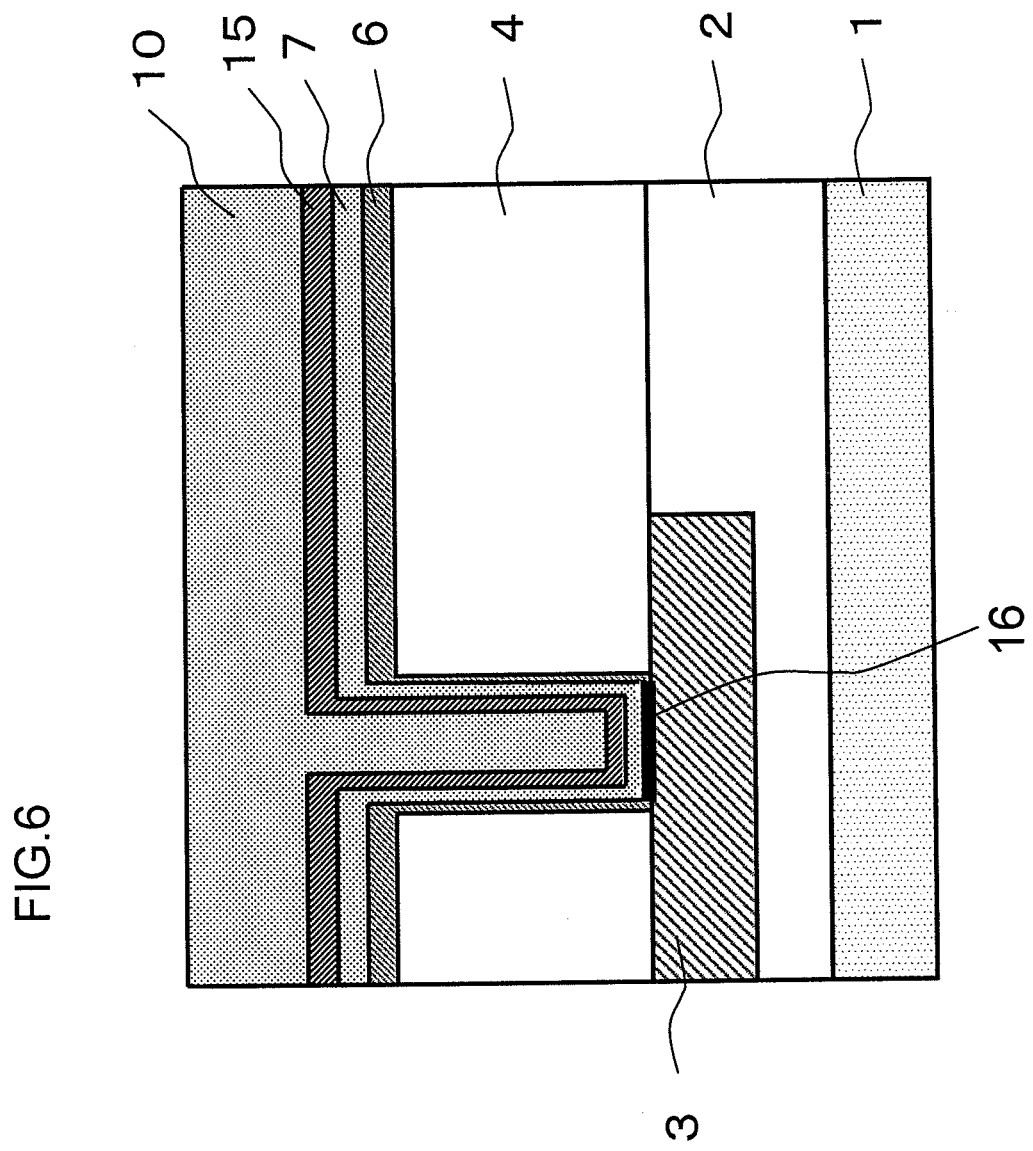
Figure 7:
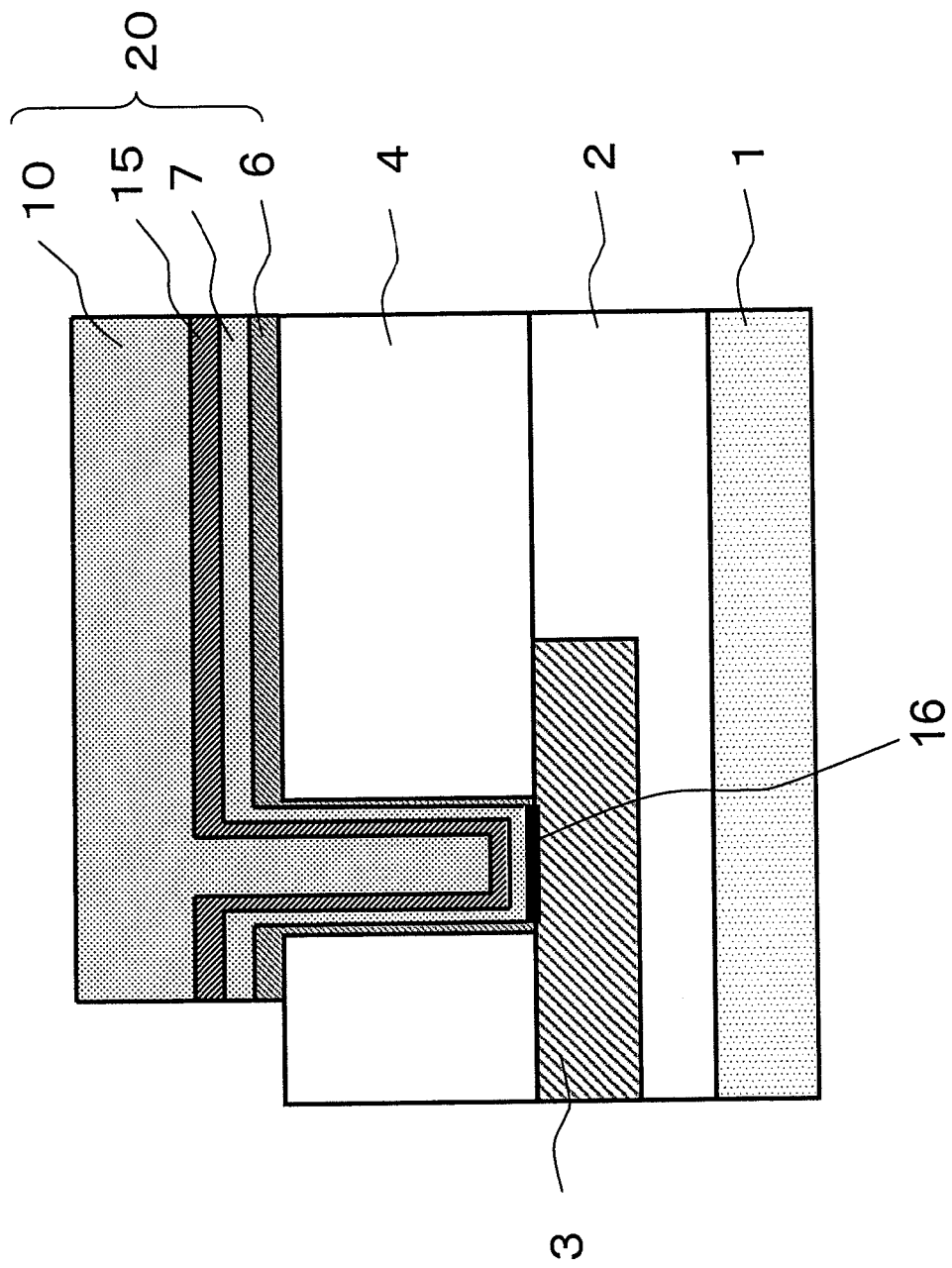
Figure 8:
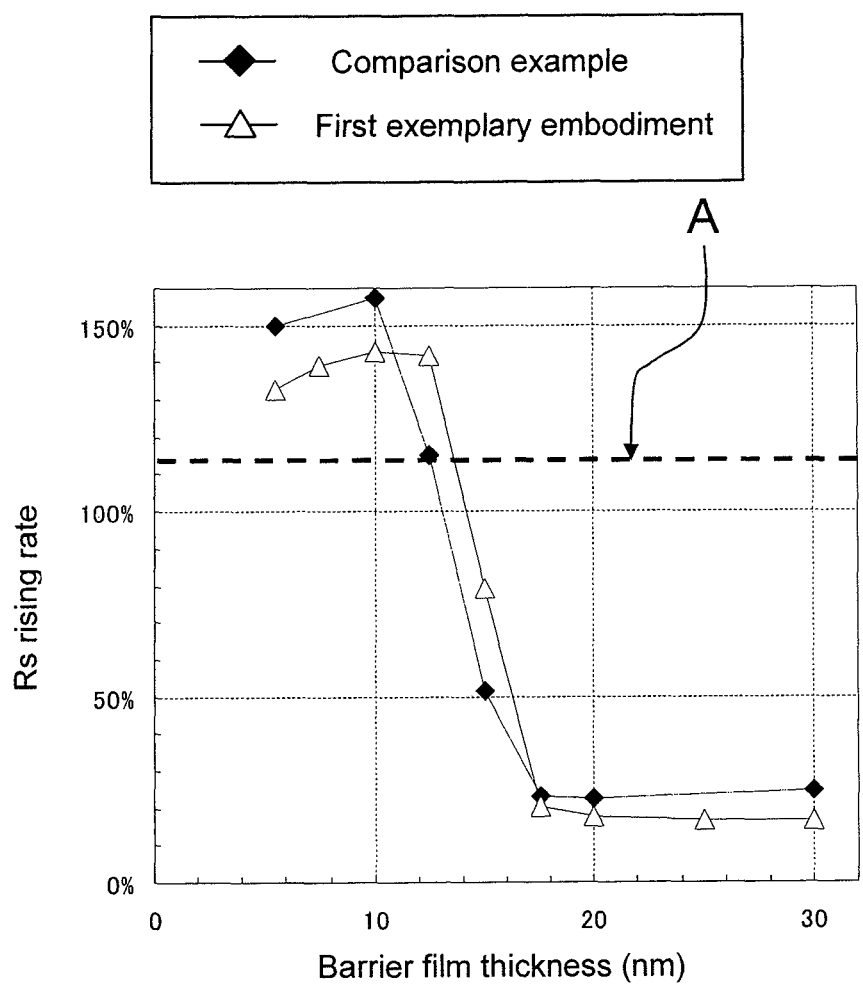

The above features and advantages of the present invention will be more apparent from the following description of certain preferred embodiments taken in conjunction with the accompanying drawings, in which:

FIG. 1 to FIG. 7 illustrates a method for manufacturing a semiconductor device according to a first exemplary embodiment; and FIG. 8 is a graph illustrating measurement results of sheet resistance rising rates in the first exemplary embodiment and a comparison example.

In the drawings, reference numerals have the following meanings: 1: a semiconductor substrate, 2: first interlayer insulating film, 3: Cu wire, 4: second interlayer insulating film, 5: contact hole, 6: first Ti film, 7: first TiN film, 8: second TiN film, 9: first Al film, 10: second Al film, 15: $Al_xTi_y$ film, 16: $Al_xTi_y$ film, and 20: Al wire

DETAILED DESCRIPTION OF THE EXEMPLARY EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purpose.

First Exemplary Embodiment

As shown in FIG. 1, first interlayer insulating film 2 is formed on semiconductor substrate 1 using oxide silicon ($SiO_2$) or low-dielectric material. Using a damascene method, Cu wire 3 is formed so as to be buried in first interlayer insulating film 2. Second interlayer insulating film 4 is formed on first interlayer insulating film 2 using oxide silicon ($SiO_2$) or low-dielectric material.

Using anisotropic dry etching, contact hole 5 is formed so as to penetrate through second interlayer insulating film 4. A depth of contact hole 5 is approximately 400 nm for example in case of 50 nm generation DRAM device and an aspect ratio of contact hole 5 becomes 1.5 to 3. A diameter of contact hole 5 preferably is approximately 250 to 400 nm. When the diameter of contact hole 5 is approximately 250 to 400 nm in that way, each of a plurality of films may be reliably formed within the contact hole in a subsequent process.

Figure 2:
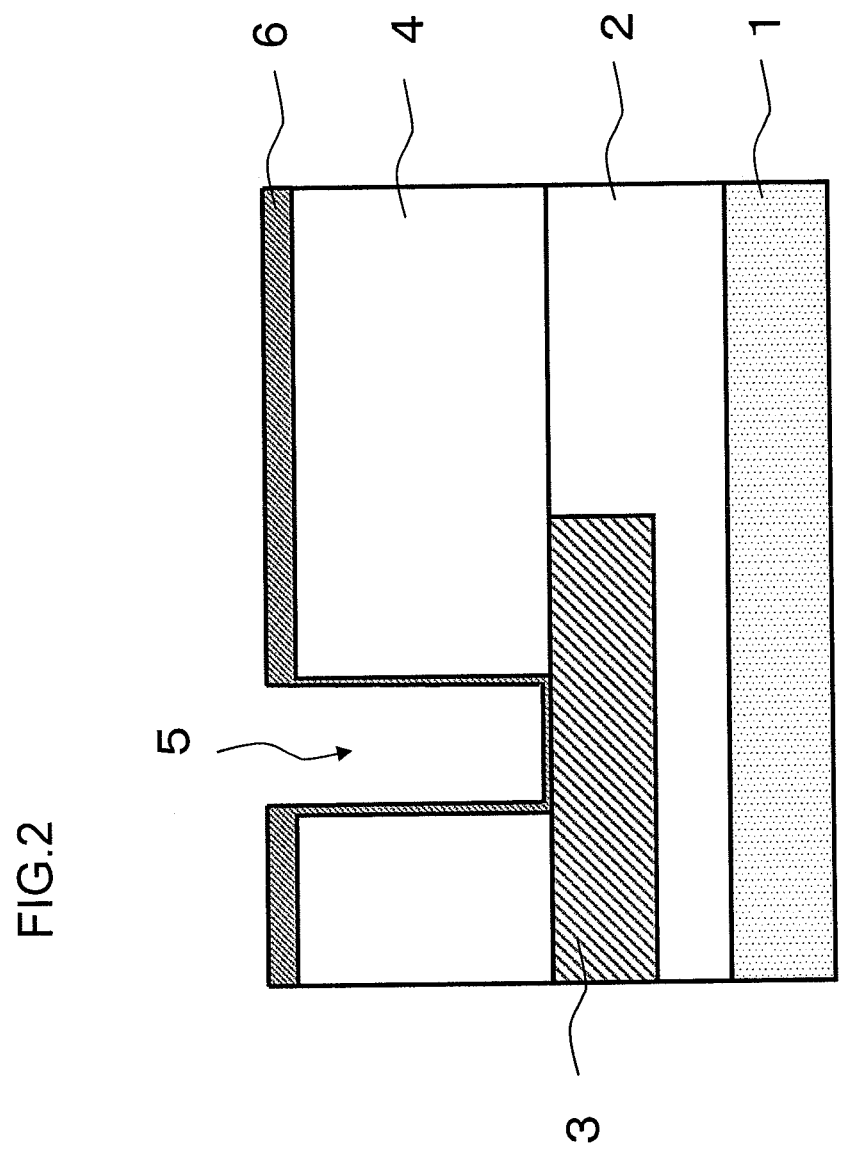

As shown in FIG. 2, a top face of Cu wire 3 is exposed in a bottom region of contact hole 5 and then is naturally oxidized, thereby forming a CuO layer (not shown) in a form of a thin film. Semiconductor substrate 1 is subjected to an annealing process at temperature equal to or higher than 300° C. under hydrogen atmosphere, so that the CuO layer at the top face of Cu wire 3 in the bottom region of contact hole 5 is removed away and thus the clean top face of Cu wire 3 is exposed.

Thereafter, by sputtering Ti material using a conventional sputtering apparatus not exhibiting improvement of the film forming coverage in a step region, first Ti film 6 is formed on an entire surface of the second interlayer insulating film so that a portion (corresponding to a second portion) of first Ti film 6 on the second interlayer insulating film has approximately 20 nm thickness. In this case, the film forming coverage in the bottom region of contact hole 5 becomes equal to or less than 5% and accordingly a portion (corresponding to a first portion) of first Ti film 6 deposited on the top face of Cu wire 3 in the bottom region of contact hole 5 has film thickness equal to or smaller than 1 nm.

Figure 3:
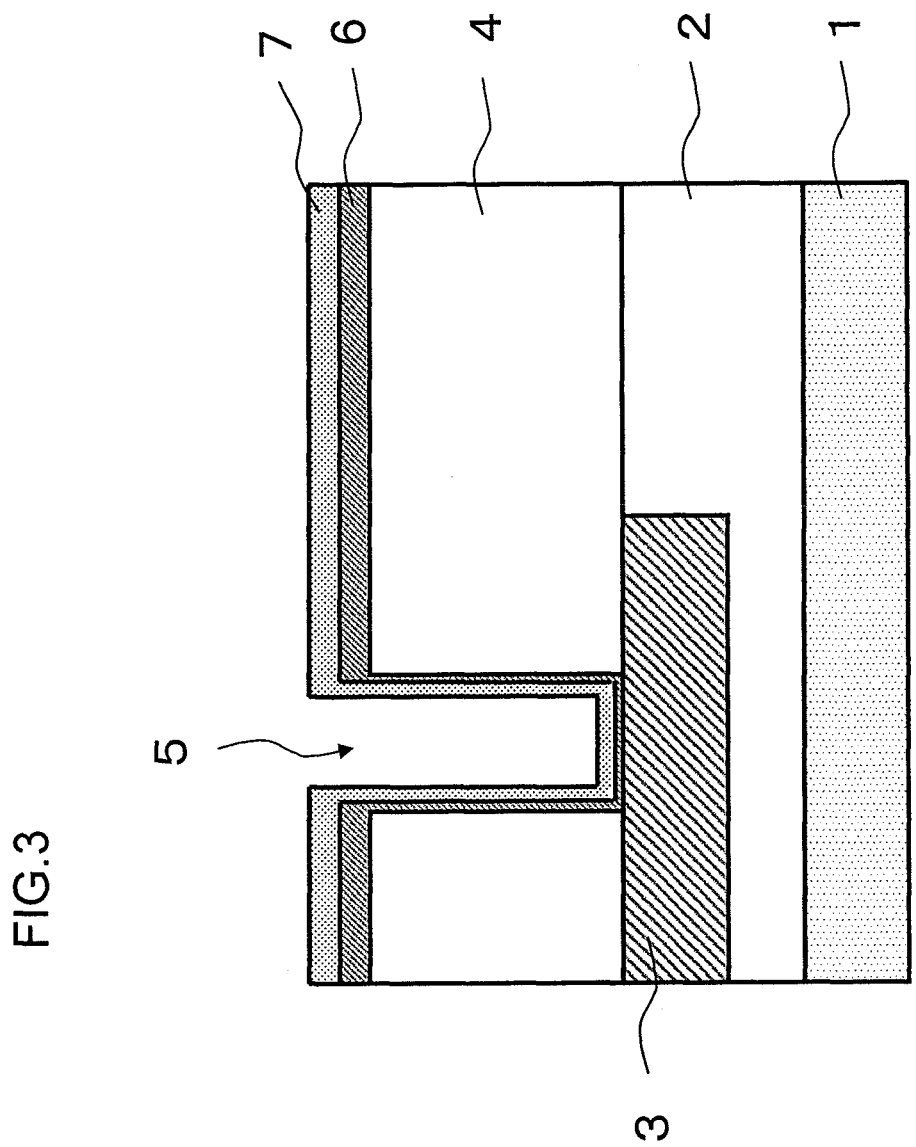

As shown in FIG. 3, by sputtering TiN material using a sputtering apparatus exhibiting the improvement of the film forming coverage in the step region, TiN film 7 is formed on an entire surface of first Ti film 6 so that a portion (corresponding to a fourth portion) of TiN film 7 over the second interlayer insulating film has approximately 30 nm thickness.

A specific example of the sputtering apparatus exhibiting the improvement of the film forming coverage in the step region may include a long-throw type sputtering apparatus, a collimator type sputtering apparatus, or an ionization sputtering apparatus. In this case, the film forming coverage in the bottom region of contact hole 5 becomes equal to or more than 10% and accordingly a portion (corresponding to a third portion) of TiN film 7 deposited over the top face of Cu wire 3 in the bottom region of contact hole 5 has film thickness equal to or larger than 3 nm.

Figure 4:
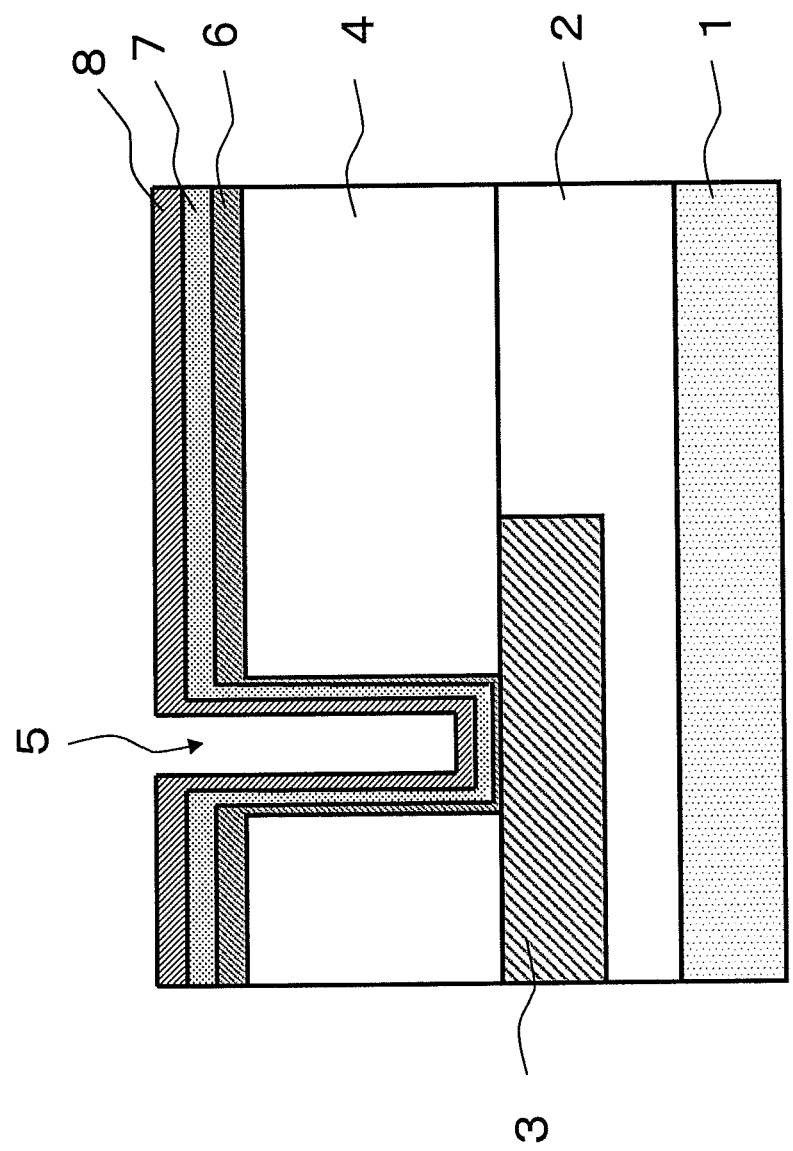

As shown in FIG. 4, by sputtering Ti material using a sputtering apparatus exhibiting the improvement of the film forming coverage in the step region, second Ti film 8 is formed on an entire surface of TiN film 7 so that a portion (corresponding to a sixth portion) of second Ti film 8 over the second interlayer insulating film has approximately 20 nm thickness. A specific example of the sputtering apparatus exhibiting the improvement of the film forming coverage in the step region may include a long-throw type sputtering apparatus, a collimator type sputtering apparatus, or an ionization sputtering apparatus, In this case, the film forming coverage in the bottom region of contact hole 5 becomes equal to or more than 10% and accordingly a portion (corresponding to a fifth portion) of second Ti film 8 deposited over the top face of Cu wire 3 in the bottom region of contact hole 5 has film thickness equal to or larger than 2 nm. Second Ti film 8, when performing a subsequent aluminum reflow method, serves as a wetting layer for improving reflowing rate of an aluminum film within contact hole 5.

Figure 5:
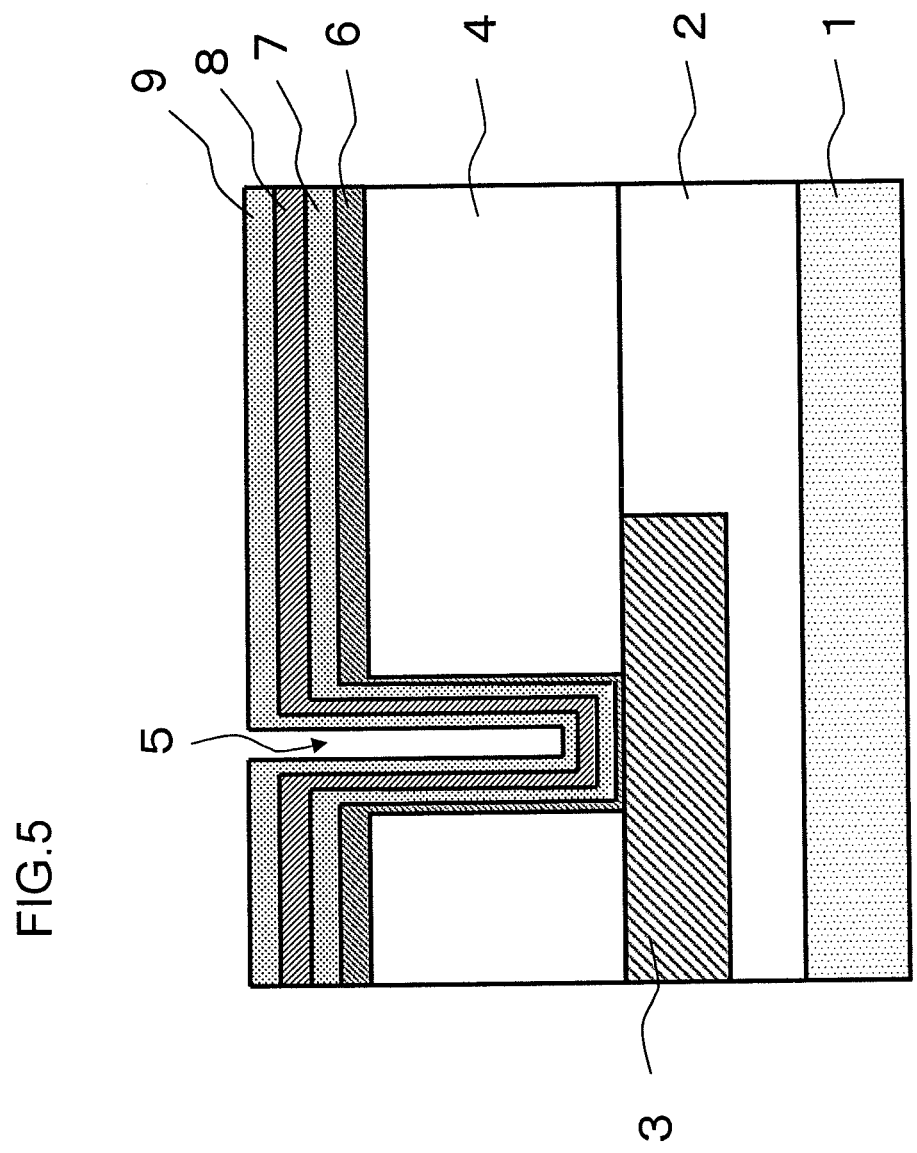

As shown in FIG. 5, by sputtering Al material at room temperature using a sputtering apparatus exhibiting the improvement of the film forming coverage in the step region, first Al film 9 is formed on an entire surface of second Ti film 8 so that a portion (corresponding to a eighth portion) of first Al film 9 over the second interlayer insulating film has approximately 150 nm thickness. A specific example of the sputtering apparatus exhibiting the improvement of the film forming coverage in the step region may include a long-throw type sputtering apparatus, a collimator type sputtering apparatus, or an ionization sputtering apparatus, In this case, the film forming coverage in the bottom region of contact hole 5 becomes equal to or more than 10% and accordingly a portion (corresponding to a seventh portion) of first Al film 9 deposited over the top face of Cu wire 3 in the bottom region of contact hole 5 has film thickness equal to or larger than 15 nm. First Al film 9, when performing the subsequent aluminum reflow method, serves as a seed Al film.

As shown in FIG. 6, using the aluminum reflow method, second Al film 10 is formed on an entire surface of first Al film 9 so that a portion of second Al film 10 over the second interlayer insulating film has approximately 1 μm thickness. To be specific, Al material is sputtered while semiconductor substrate 1 is heated to 400 to 500° C., and thus the Al material reflows with the thermal reaction, thereby filling the Al material into contact hole 5. At this time, first Al film 9 as the seed layer and second Ti film 8 as the wetting layer react on each other with the thermal reaction, thereby forming $Al_xTi_y$ alloy film 15 (corresponding to an aluminum titanium alloy film), and, at the same time, $Al_xTi_y$ alloy film 16 is formed with first Ti film 6 and Cu wire 3 on the top face of Cu wire 3 in the bottom region of contact hole 5. Contact hole 5 is filled with Al film 10, resulting in forming the contact plug.

In this exemplary embodiment, first Ti film 6 is first formed by the sputtering exhibiting the film forming coverage equal to or less than 5% in the bottom region of the contact hole and therefore the reaction between first Ti film 6 and Cu Wire 3 is retarded. Meanwhile, first Ti film 6 on second interlayer insulating film 4 has the sufficient film thickness of approximately 20 nm and thus crystalline growth of second Al film 10 through TiN film 7 formed thereon may be effectively enhanced. As a result, the reliable Al wire layer may be acquired.

As shown in FIG. 7, Al wire 20 is formed by patterning the conductive films on second interlayer insulating film 4.

In order to check out the effect of this exemplary embodiment, a sample is manufactured in which a Ti film, a barrier layer, and an Al film formed using a conventional sputtering method without using the reflow method are deposited sequentially as conductive films, on silicon oxide formed on a semiconductor substrate. Measured is a sheet resistance (Rs) rising rate of the conductive films before/after an annealing process at the temperature 420° C. corresponding to the reflowing temperature. The sheet resistance (Rs) rising rate is represented as follows:

{(A sheet resistance after the annealing process)−
(a sheet resistance before the annealing process)}/
(the sheet resistance before the annealing process)×
100(%)

Speaking specifically, there are prepared two sample, i.e., a sample (first exemplary embodiment) in which a Ti film with the thickness equal to or smaller than 1 nm, a barrier layer made of a TiN film and an Al film are formed sequentially, and a comparison sample in which a conventional Ti film with approximately 10 nm thickness, a barrier layer made of $TiO_x$ (titanium oxide) film and a TiN film, and an Al film are formed sequentially. FIG. 8 shows the sheet resistance measurement results of a plurality of the samples which have different film thickness of the barrier layer made of the TiN film from one another.

A broken line A in FIG. 8 represents the sheet resistance rising rate in case the barrier layer is not formed and the Al film is directly deposited on the Cu film. In this case, Al/Cu alloy is formed with the annealing process at 420° C. and the sheet resistance Rs comes into rising more than two times. From FIG. 8, the degree of inter-diffusion between the Al and Cu materials depends on the film thickness of the barrier film. To be specific, destruction of the barrier due to the thermal energy in the annealing process may occur in a thin barrier film region and hence the Al and Cu may easily diffuse into each other and be alloyed with each other with thermal energy, resulting in considerably enhancing the sheet resistance Rs. On the other hand, in a region at which the thickness of the barrier layer becomes equal to or larger than a given thickness, the barrier layer is not destroyed but remains after the annealing process. Therefore, the Al and Cu may not diffuse into each other and not be alloyed with each other with thermal energy, resulting in suppressing the rising of the sheet resistance Rs.

Regarding the comparison between the first embodiment and the comparison example, entire shapes of the curves are substantially similar with each other and the barrier layer effectively functions against the thermal reaction in the conductive films according to the first embodiment. Moreover, in a region at which the film thickness of the barrier layer is small, the sheet resistance Rs rising rate is lower in the first exemplary embodiment of the invention than in the comparison example. This is because in the first embodiment, Cu—Ti alloy is hardly formed.

As mentioned above, in accordance with the first exemplary embodiment, it is possible to provide, the semiconductor device in which the rising of the contact resistance may be suppressed without adding an extra process.

It is apparent that the present invention is not limited to the above embodiments, but may be modified and changed without departing from the scope and spirit of the invention.

What is claimed is:

1. A method for manufacturing a semiconductor device comprising:
    forming a copper (Cu) wire in a first interlayer insulating film so as to be exposed;
    forming a second interlayer insulating film on the first interlayer insulating film;
    forming a contact hole in the second interlayer insulating film so as to expose the Cu wire;
    forming a first titanium (Ti) film on an inner wall of the contact hole and on the second interlayer insulating film so that a ratio of a thickness of a first portion of the first Ti film on a bottom face of the contact hole to a thickness of a second portion of the first Ti film on the second interlayer insulating film becomes equal to or smaller than 5/100;
    forming a titanium nitride (TiN) film, a second Ti film and a first aluminum (Al) film sequentially on the first Ti film formed on the inner wall of the contact hole and on the second interlayer insulating film; and
    forming a second Al film using an aluminum reflow method so as to fill the contact hole and cover the first Al film over the second interlayer insulating film, wherein when the aluminum reflow method is used, the second Ti film and the first Al film are alloyed with each other to form an Al—Ti alloy film.

2. The method according to claim 1,
    wherein in forming the titanium nitride (TiN) film, the second Ti film and the first aluminum (Al) film sequentially, the TiN film is formed so that a ratio of a thickness of a third portion of the TiN film over the bottom face of the contact hole to a thickness of a fourth portion of the TiN film over the second interlayer insulating film becomes equal to or larger than 10/100.

3. The method according to claim 2,
    wherein in forming the titanium nitride (TiN) film, the second Ti film and the first aluminum (Al) film sequentially, the TiN film is formed so that the thickness of the third portion is equal to or larger than 3 nm.

4. The method according to claim 1,
    wherein in forming the titanium nitride (TiN) film, the second Ti film and the first aluminum (Al) film sequentially, the second Ti film is formed so that a ratio of a thickness of a fifth portion of the second Ti film over the bottom face of the contact hole to a thickness of a sixth portion of the second Ti film over the second interlayer insulating film becomes equal to or larger than 10/100.

5. The method according to claim 4,
    wherein in forming the titanium nitride (TiN) film, the second Ti film and the first aluminum (Al) film sequentially, the second Ti film is formed so that the thickness of the fifth portion is equal to or larger than 2 nm.

6. The method according to claim 1,
    wherein in forming the titanium nitride (TiN) film, the second Ti film and the first aluminum (Al) film sequentially, the first Al film is formed so that a ratio of a thickness of a seventh portion of the first Al film over the bottom face of the contact hole to a thickness of an eighth portion of the first Al film over the second interlayer insulating film becomes equal to or larger than 10/100.

7. The method according to claim 6,
    wherein in forming the titanium nitride (TiN) film, the second Ti film and the first aluminum (Al) film sequentially, the first Al film is formed so that the thickness of the seventh portion is equal to or larger than 15 nm.

8. The method according to claim 1, wherein in forming the first titanium (Ti) film, the first Ti film is formed so that the thickness of the first portion is equal to or smaller than 1 nm.

9. The method according to claim 1, wherein in forming the contact hole, the contact hole with a diameter of 250 to 400 nm is formed.

10. The method according to claim 1, wherein in forming the contact hole, the contact hole with an aspect ratio of 1.5 to 3 is formed.

11. The method according to claim 1, wherein in forming the titanium nitride (TiN) film, the second Ti film and the first aluminum (Al) film sequentially, the titanium nitride (TiN) film, the second Ti film and the first aluminum (Al) film are formed using a long-throw type sputtering apparatus, a collimator type sputtering apparatus, or an ionization sputtering apparatus.

12. The method according to claim 1, wherein the aluminum reflow method is performed at 400 to 500° C. temperature.

13. A method for manufacturing a semiconductor device, comprising:
   forming a copper (Cu) wire in a first interlayer insulating film so as to be exposed;
   forming a second interlayer insulating film on the first interlayer insulating film;
   forming a contact hole in the second interlayer insulating film so as to expose the Cu wire;
   forming a first titanium (Ti) film on an inner wall of the contact hole and on the second interlayer insulating film so that a thickness of a first portion of the first Ti film on a bottom face of the contact hole is thinner than a thickness of a second portion of the first Ti film on the second interlayer insulating film;
   forming a titanium nitride (TiN) film on the first Ti film formed on the inner wall of the contact hole and on the second interlayer insulating film so that a thickness of a third portion of the TiN film over the bottom face of the contact hole is thinner than a thickness of a fourth portion of the TiN film over the second interlayer insulating film;
   forming a second titanium (Ti) film on the TiN film over the inner wall of the contact hole and over the second interlayer insulating film so that a thickness of a fifth portion of the second Ti film over the bottom face of the contact hole is thinner than a thickness of a sixth portion of the second Ti film over the second interlayer insulating film;
   forming a first aluminum (Al) film on the second Ti film over the inner wall of the contact hole and over the second interlayer insulating film so that a thickness of a seventh portion of the first Al film over the bottom face of the contact hole is thinner than a thickness of an eighth portion of the first Al film over the second interlayer insulating film; and
   forming a second Al film using an aluminum reflow method so as to fill the contact hole and cover the first Al film over the second interlayer insulating film, wherein when the aluminum reflow method is used, the second Ti film and the first Al film are alloyed with each other to form an Al—Ti alloy film.

14. A method for manufacturing a semiconductor device comprising:
   forming a copper wire in a first interlayer insulating film;
   forming a second interlayer insulating film on the first interlayer insulating film;
   forming a hole in the second interlayer insulating film to expose a part of the copper wire;
   forming a first film including a first material on the copper wire, on an inner wall of the hole and on the second interlayer insulating film so that a thickness of a first portion of the first film on the copper wire is thinner than a thickness of a second portion of the first film on the second interlayer insulating film, the first film having a first ratio of the thickness of the first portion of the first film on the copper wire to the thickness of the second portion of the first film on the second interlayer insulation film;
   forming a second film including the first material on the first film so that a thickness of a third portion of the second film over the copper wire is thinner than a thickness of a fourth portion of the second film over the second interlayer insulating film, the second film having a second ratio of the thickness of the third portion of the second film over the copper wire to the thickness of the fourth portion of the second film over the second interlayer insulating film; and
   forming a conductive film including a third film and a metal on the second film in the hole so that a thickness of a fifth portion of the third film over the copper wire is thinner than a thickness of a sixth portion of the third film over the second interlayer insulating film, the third film having a third ratio of the thickness of the fifth portion of the third film over the copper wire to the thickness of the sixth portion of the third film over the second interlayer insulating film,
   wherein the first ratio is smaller than at least one of the second and third ratios.

15. The method according to claim 14, wherein the conductive film includes a second material different from the first material.

16. The method according to claim 14, wherein the third film includes the first material.

17. The method according to claim 16, wherein the metal film includes a first aluminum film.

18. The method according to claim 15, further comprising forming a second aluminum film on the conductive film using an aluminum reflow method.

19. The method according to claim 14, wherein the first material includes titanium.

20. The method according to claim 19, wherein the second film includes titanium nitride.

21. The method according to claim 14, wherein the first ratio is equal to or smaller than 5/100, the second ratio is equal to or larger than 10/100 and the third ratio is equal to or larger than 10/100.

* * * * *